(12) United States Patent
Gai et al.

(10) Patent No.: US 10,490,573 B2
(45) Date of Patent: Nov. 26, 2019

(54) ARRAY SUBSTRATE, MANUFACTURING METHOD THEREOF, DISPLAY PANEL AND DISPLAY DEVICE

(71) Applicant: BOE TECHNOLOGY GROUP CO., LTD., Beijing (CN)

(72) Inventors: Cuili Gai, Beijing (CN); Xiaodi Liu, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 63 days.

(21) Appl. No.: 15/826,184

(22) Filed: Nov. 29, 2017

(65) Prior Publication Data

US 2018/0083050 A1 Mar. 22, 2018

Related U.S. Application Data

(62) Division of application No. 14/443,542, filed as application No. PCT/CN2014/086921 on Sep. 19, 2014, now abandoned.

(30) Foreign Application Priority Data

Jun. 17, 2014 (CN) .......................... 2014 1 0270423

(51) Int. Cl.
*H01L 27/12* (2006.01)
*G02F 1/1362* (2006.01)
(Continued)

(52) U.S. Cl.
CPC .... *H01L 27/1237* (2013.01); *G02F 1/136204* (2013.01); *H01L 27/1262* (2013.01);
(Continued)

(58) Field of Classification Search
CPC ... H01L 27/32–326; H01L 51/50–5012; H01L 51/525–5287;
(Continued)

(56) References Cited

U.S. PATENT DOCUMENTS 6,133,609 A * 10/2000 Nakamura .......... H01L 27/1237
257/347
6,608,357 B1 8/2003 Yamazaki et al.
(Continued)

FOREIGN PATENT DOCUMENTS

CN 1501153 A 6/2004
CN 1691353 A 11/2005
(Continued)

OTHER PUBLICATIONS

PCT/ISA/210 dated Sep. 19, 2014 issued in International Application No. PCT/CN2014/086921.
(Continued)

*Primary Examiner* — Cuong B Nguyen
*Assistant Examiner* — Samuel Park
(74) *Attorney, Agent, or Firm* — Nath, Goldberg & Meyer; Joshua B. Goldberg

(57) ABSTRACT

The present invention provides a manufacturing method of an array substrate, comprising a step of forming insulation layers in a driving area and a display area of the array substrate, wherein thin film transistors are provided in both the display area and the driving area; the insulation layers are arranged between gate electrodes and active layers of the thin film transistors. A thickness of the insulation layer of the thin film transistor in the driving area is larger than a thickness of the insulation layer of the thin film transistor in the display area.

2 Claims, 5 Drawing Sheets

(51) Int. Cl.
*H01L 29/423* (2006.01)
*H01L 27/02* (2006.01)

(52) U.S. Cl.
CPC .... *H01L 27/1288* (2013.01); *H01L 29/42384* (2013.01); *H01L 27/0248* (2013.01); *H01L 2029/42388* (2013.01)

(58) Field of Classification Search
CPC . H01L 2227/32–326; H01L 2251/5323–5361; H01L 2924/12044; H01L 2021/775; H01L 27/1214; H01L 27/124; H01L 27/3232; H01L 51/0076; H01L 27/14603; H01L 27/14605; H01L 27/14609; H01L 27/14812; H01L 27/3248; H01L 27/326
See application file for complete search history.

(56) References Cited

U.S. PATENT DOCUMENTS

| | | | | |
|---|---|---|---|---|
| 2003/0025127 | A1* | 2/2003 | Yanai | H01L 27/12 257/158 |
| 2003/0124778 | A1* | 7/2003 | Doi | H01L 27/1214 438/151 |
| 2004/0195568 | A1* | 10/2004 | Okumura | H01L 27/1237 257/59 |
| 2005/0127369 | A1 | 6/2005 | Toya | |
| 2006/0267895 | A1* | 11/2006 | Yanase | H01L 27/1237 345/92 |
| 2008/0179597 | A1* | 7/2008 | Yamazaki | H01L 27/12 257/59 |
| 2011/0170274 | A1 | 7/2011 | Moriwaki | |
| 2014/0124750 | A1 | 5/2014 | Chang et al. | |

FOREIGN PATENT DOCUMENTS

| | | |
|---|---|---|
| CN | 101089714 A | 12/2007 |
| CN | 202886795 U | 4/2013 |
| CN | 103855170 A | 6/2014 |
| CN | 204029806 U | 12/2014 |
| JP | 2014-010355 A | 1/2014 |
| KR | 20090088180 A | 8/2009 |

OTHER PUBLICATIONS

PCT/ISA/237 dated Mar. 23, 2015 issued in International Application No. PCT/CN2014/086921.
First Office Action dated May 3, 2016 issued in corresponding Chinese Application No. 201410270423.5.
Second Office Action dated Jul. 21, 2016 issued in corresponding Chinese Application No. 201410270423.5.

* cited by examiner

ARRAY SUBSTRATE, MANUFACTURING METHOD THEREOF, DISPLAY PANEL AND DISPLAY DEVICE

FIELD OF THE INVENTION

The present invention belongs to the field of display technology, and particularly relates to an array substrate, a manufacturing method thereof, a display panel including the array substrate and a display device.

BACKGROUND OF THE INVENTION

Static electricity exists everywhere during manufacturing, packaging, testing and using an array substrate including thin film transistors, accumulated electrostatic charges are released within nanoseconds to microseconds in the current of several amperes or tens of amperes, the instantaneous power is up to hundreds of kilowatts, and the discharge energy can reach millijoule, so that the destruction strength on the thin film transistors is very large.

Therefore, an electrostatic protection design in the thin film transistor design directly relates to the stability of the function of a chip and is very important. With the development of the process, the feature size of a device has gradually become smaller, and the thickness of an insulation layer (located between a gate electrode and an active layer and is also called a gate oxide or a gate insulation layer) in the thin film transistor has reduced proportionally. The gate insulation layer is usually made from silicon dioxide, the dielectric strength of which is approximately $8 \times 10^6$ V/cm, thus the breakdown voltage of the gate insulation layer with a thickness of 10 nm is about 8 V. Although such breakdown voltage is more than twice of 3.3 V supply voltage, the peak voltage of static electricity caused by all kinds of factors can be far higher than 8V, so that the insulation layer may be broken down. Moreover, with the use of new processes, such as polysilicon metallization, diffusion region metallization, polysilicon and diffusion region metallization and the like, the parasitic resistance of the device is reduced, so that the protection capacity of preventing electrostatic discharge is greatly weakened. In order to adapt to the continuous improvement of the integration density and the working speed of a super-large-scale integrated circuit, the electrostatic protection for the thin film transistor needs to be improved.

As shown in FIG. 1, an array substrate includes a display area for displaying and a driving area located around the display area. In this case, thin film transistors located on a base substrate 1 are provided in both the display area and the driving area of the array substrate, each thin film transistor is provided with an insulation layer 3 between a gate electrode 2 and an active layer 5, an etching stop layer 4 is further arranged on the active layer 5, source/drain electrodes 6 are arranged on the etching stop layer 4, and the source/drain electrodes 6 are electrically connected with the active layer 5 through vias 7, respectively.

An electrostatic protection structure is arranged in the driving area of the array substrate to release the electrostatic charges, but when too many charges are accumulated, the electrostatic discharge current is quite large and cause electrostatic discharge at the vias 7 of the thin film transistor in the driving area, so that the gate electrode and the source/drain electrodes 6 may be short circuited due to the breakdown of the insulation layer 3. Therefore, increasing the thickness of the insulation layer 3 of the thin film transistor in the driving area becomes an important measure for preventing electrostatic discharge, but in the thin film transistor in the display area of the array substrate, adverse effects such as a reduced migration rate and threshold voltage drift will be caused due to the increased thickness of the insulation layer 3, so the thickness of the insulation layer 3 of the thin film transistor in the display area cannot be too large.

In the prior art, when the insulation layer 3 (including the insulation layers in the display area and the driving area) of the array substrate as shown in FIG. 1 is formed by a patterning process, a used mask is shown in FIG. 2, and the mask includes a display area mask 9 corresponding to the display area and four driving area masks 8 corresponding to the surrounding driving areas respectively. During exposure, the above-mentioned masks are spliced and exposure is carried out, and then development and etching are performed to simultaneously obtain patterns of the insulation layers in the display area and the driving areas.

SUMMARY OF THE INVENTION

To solve the problem in the prior art that an insulation layer between a gate electrode and source/drain electrodes of a thin film transistor in a driving area of an array substrate is liable to breakdown, the object of the present invention is to provide an array substrate, a manufacturing method thereof, a display panel including the array substrate, and a display device, which can prevent the insulation layer of the thin film transistor in a driving area from being broken down and can well maintain properties of the thin film transistor in a display area.

Embodiments of the present invention provide an array substrate, including a display area for displaying and a driving area located around the display area, wherein thin film transistors are provided in both the display area and the driving area, and the thin film transistors are provided with insulation layers between gate electrodes and active layers, wherein a thickness of the insulation layer of the thin film transistor in the driving area is larger than a thickness of the insulation layer of the thin film transistor in the display area.

Preferably, the insulation layer of the thin film transistor in the driving area includes a first insulation layer and a second insulation layer; and the insulation layer of the thin film transistor in the display area includes the second insulation layer.

Preferably, the second insulation layer of the thin film transistor in the driving area is located on the first insulation layer.

Preferably, a thickness of the second insulation layer is 1000-3000 Å; and a thickness of the first insulation layer is 2000-6000 Å.

The embodiments of the present invention further provide a manufacturing method of an array substrate, including a step of forming insulation layers in a driving area and a display area of the array substrate, wherein thin film transistors are provided in both the display area and the driving area; a insulation layers are arranged between gate electrodes and active layers of the thin film transistors; and a thickness of the insulation layer of the thin film transistor in the driving area is larger than the thickness of the insulation layer of the thin film transistor in the display area.

Preferably, the step of forming the insulation layers in the driving area and the display area of the array substrate includes:

a step of forming a pattern including the first insulation layer of the thin film transistor in the driving area through a patterning process; and a step of forming a pattern including a second insulation layer of the thin film transistors in the driving area and the display area through a patterning process.

Preferably, in the steps of forming the pattern including the first insulation layer and forming the pattern including the second insulation layer through a patterning process, the same display area mask is adopted, and the display area mask includes a blank part without a pattern and a pattern part with a pattern corresponding to the second insulation layer in the display area; and in the steps of forming the pattern including the first insulation layer and forming the pattern including the second insulation layer through a patterning process, a photoresist layer in the display area is exposed for multiple times to form the pattern required.

Preferably, the blank part and the pattern part of the display area mask each symmetrically occupy a half of the display area respectively.

The embodiments of the present invention further provide a display panel, including the above-mentioned array substrate.

The embodiments of the present invention further provide a display device, including the above-mentioned display panel.

The array substrate, the display panel and the display device of the present invention include the display area and the driving area, and the thickness of the insulation layer of the thin film transistor in the driving area is larger than the thickness of the insulation layer of the thin film transistor in the display area. Therefore, when electrostatic discharge occurs between the gate electrode and the source/drain electrodes of the driving area, breakdown of the insulation layer can be prevented, thereby resulting in no short circuit of the gate electrode and the source/drain electrodes; in addition, the insulation layer is also a dielectric layer for a storage capacitor (the capacitor formed between the gate electrode and the source/drain electrodes), and since the thickness of the insulation layer of the thin film transistor in the display area is small, the storage capacitance of the display area can be maintained or increased; meanwhile, since the thickness of the insulation layer of the thin film transistor in the display area is small, adverse effects such as a reduced migration rate and threshold voltage drift of the thin film transistor in the display area will not be caused.

REFERENCE NUMERALS

1. base substrate; 2. gate electrode; 3. insulation layer; 31. first insulation layer; 32. second insulation layer; 4. etching stop layer; 5. active layer; 6. source/drain electrodes; 7. via; 8. driving area mask; 9. display area mask; 91. blank part; 92. pattern part.

DETAILED DESCRIPTION OF THE EMBODIMENTS

In order that those skilled in the art can better understand the technical solutions of the present invention, a further detailed description of the present invention will be given below in conjunction with the accompanying drawings and specific embodiments.

It should be noted that, the so called patterns in the present invention refer to various structures formed by a patterning process.

First Embodiment

Figure 1:
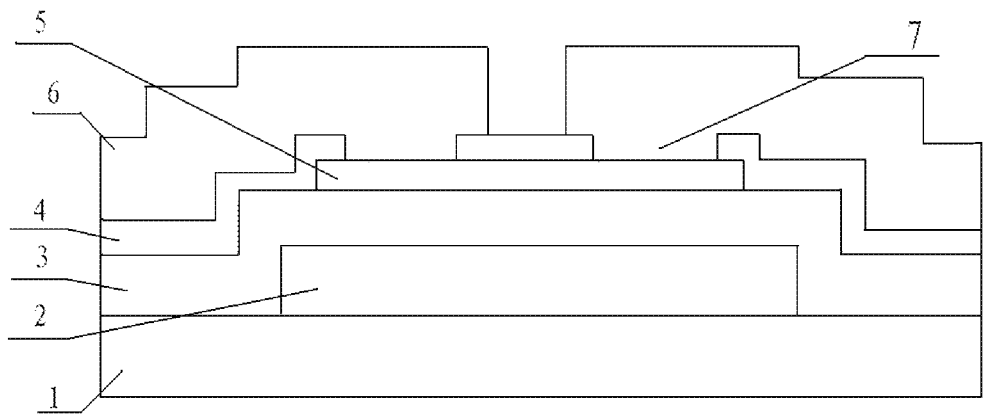
FIG. 1 is a schematic sectional view of a structure of a thin film transistor of an array substrate in the prior art.
Figure 2:
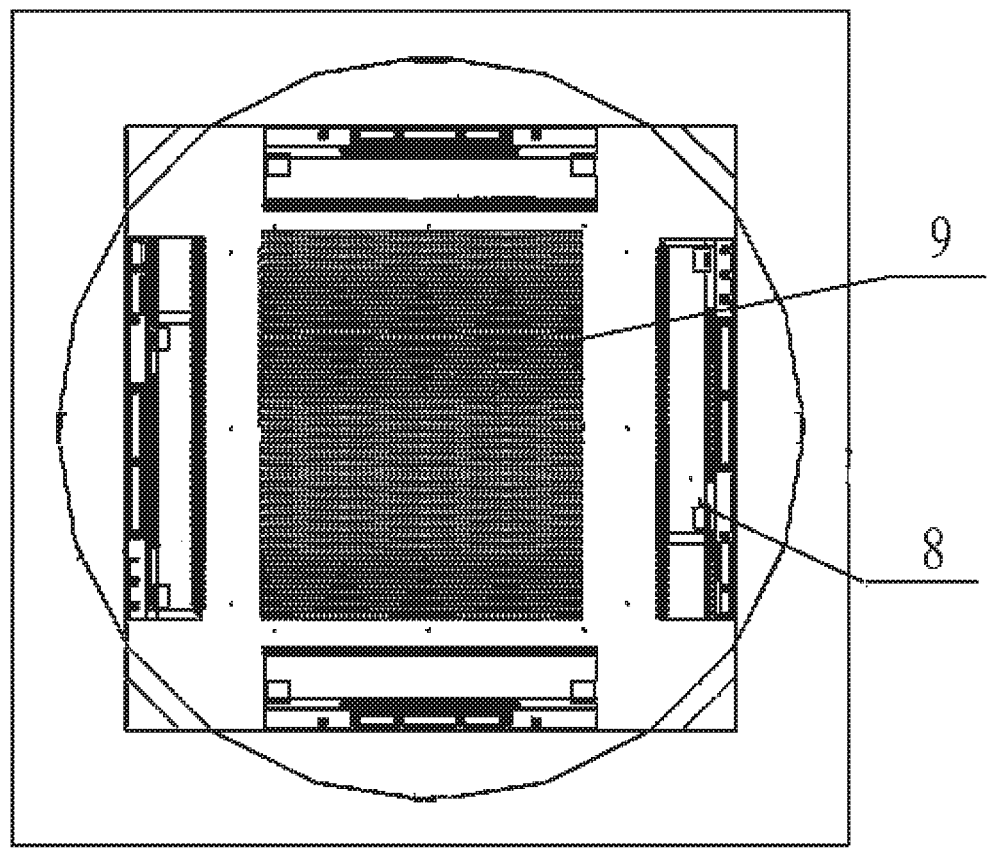
FIG. 2 is a schematic diagram of a structure of a mask used for preparing an insulation layer of an array substrate in the prior art.
Figure 3:
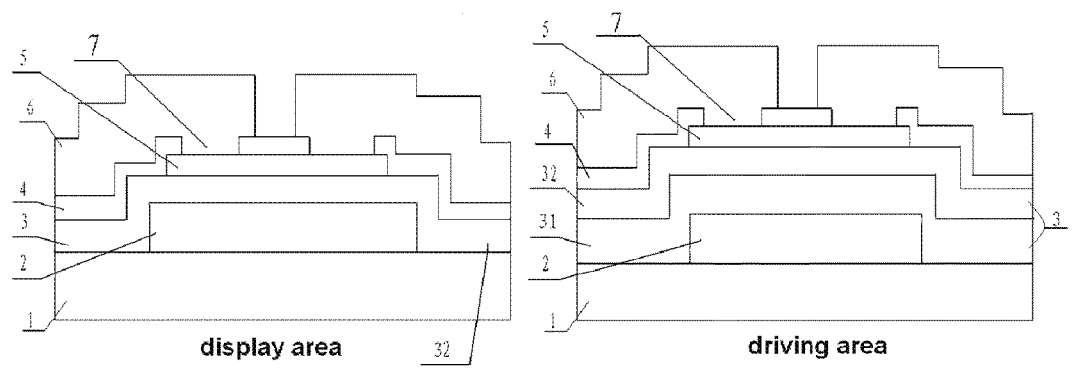
FIG. 3 is a schematic sectional view of structures of thin film transistors in a display area and a driving area of an array substrate according to a first embodiment of the present invention.

FIG. 3 is a schematic sectional view of structures of thin film transistors of a display area and a driving area of an array substrate according to the embodiment of the present invention.

As shown in FIG. 3, the array substrate in the embodiment includes a display area for displaying and a driving area located around the display area, wherein thin film transistors are provided in both the display area and the driving area; the thin film transistors are provided with insulation layers 3 between gate electrodes 2 and active layers 5, and a thickness of the insulation layer 3 of the thin film transistor in the driving area is larger than a thickness of the insulation layer 3 of the thin film transistor in the display area.

In the array substrate in the embodiment, since the thickness of the insulation layer 3 of the thin film transistor in the driving area is larger than the thickness of the insulation layer 3 of the thin film transistor in the display area, breakdown of the insulation layer 3 can be prevented when electrostatic discharge occurs between the gate electrode 2 and source/drain electrodes 6 of the driving area, thereby resulting in no short circuit of the gate electrode and the source/drain electrodes; in addition, the insulation layer 3 is also a dielectric layer for a storage capacitor (the capacitor formed between the gate electrode and the source/drain electrodes), and since the thickness of the insulation layer 3 of the thin film transistor in the display area is small, the storage capacitance of the display area can be maintained or increased; meanwhile, since the thickness of the insulation layer 3 of the thin film transistor in the display area is small, adverse effects such as a reduced migration rate and threshold voltage drift of the thin film transistor in the display area will not be caused.

Specifically, as shown FIG. 3, the present invention is specifically described with a bottom gate type thin film transistor as an example. However, it should be understood that the present invention is also applicable to top gate type thin film transistors.

The array substrate includes a base substrate 1, wherein the gate electrode 2 is arranged on the base substrate 1; the insulation layer 3 is arranged on the gate electrode 2; the active layer 5 is arranged on the insulation layer 3; an etching stop layer 4 is arranged on the active layer 5; the source/drain electrodes 6 are arranged on the etching stop layer 4 in a same layer at interval; and the source/drain electrodes 6 are electrically connected with the active layer 5 through vias 7 formed in the etching stop layer 4, respectively. It is important to note that the total thickness of the insulation layers 3 of the thin film transistor in the driving area is larger than the thickness of the insulation layer 3 of the thin film transistor in the display area.

Of course, the array substrate can further include other known structures, such as a gate line, a data line, a pixel electrode and the like, and no detailed description will be given herein.

Specifically, in a preferred implementation of the embodiment of the present invention, the insulation layer 3 of the thin film transistor in the driving area may include a first insulation layer 31 and a second insulation layer 32, while the insulation layer 3 of the thin film transistor in the display area only includes a second insulation layer 32. That is to say, during preparation, the second insulation layers 32 can be simultaneously formed in the thin film transistors in the display area and the driving area, and the first insulation layer 31 is only formed in the thin film transistor in the driving area. In this way, the thicknesses of the second insulation layers 32 of the thin film transistors in the display area and the driving area are equal, and the first insulation layer 31 is further formed in the thin film transistor in the driving area, so the total thickness of the insulation layer 3 of the thin film transistor in the driving area is larger than the thickness of the insulation layer 3 of the thin film transistor in the display area.

As shown in FIG. 3, the second insulation layer 32 of the thin film transistor in the driving area is preferably located on the first insulation layer 31 (or, for the bottom gate type thin film transistor, the second insulation layer 32 of the thin film transistor in the driving area is closer to the active layer 5 than the first insulation layer 31), and this is because such a structure is relatively easy to manufacture (a detailed description will be given in the following manufacturing method).

By arranging the separate second insulation layer 32, the thickness of the first insulation layer 31 can be independently adjusted conveniently, namely, when the thickness of the insulation layer 3 of the thin film transistor in the driving area is to be increased, no influence is generated on the thickness of the insulation layer 3 of the thin film transistor in the display area.

Of course, the insulation layer 3 in the display area can also be configured by gradient exposure to have such a thickness that does not affect the property of the thin film transistor, and meanwhile the thickness of the insulation layer 3 of the thin film transistor in the driving area can be controlled according to specific application conditions. That is to say, the insulation layers 3 in the display area and the driving area can also be formed in one patterning process, but need to be configured by gradient exposure to have different thicknesses.

Preferably, the thickness of the second insulation layer 32 is 1000-3000 Å, while the thickness of the first insulation layer 31 can be adjusted according to different application conditions of the array substrate and is generally set to 2000-6000 Å. In this case, the thickness of the second insulation layer 32 can make basic features of the thin film transistor in the display area meet the application requirements, and the thickness of the first insulation layer 31 can ensure that the insulation layer 3 of the thin film transistor in the driving area is not broken down.

Second Embodiment

Figure 7:
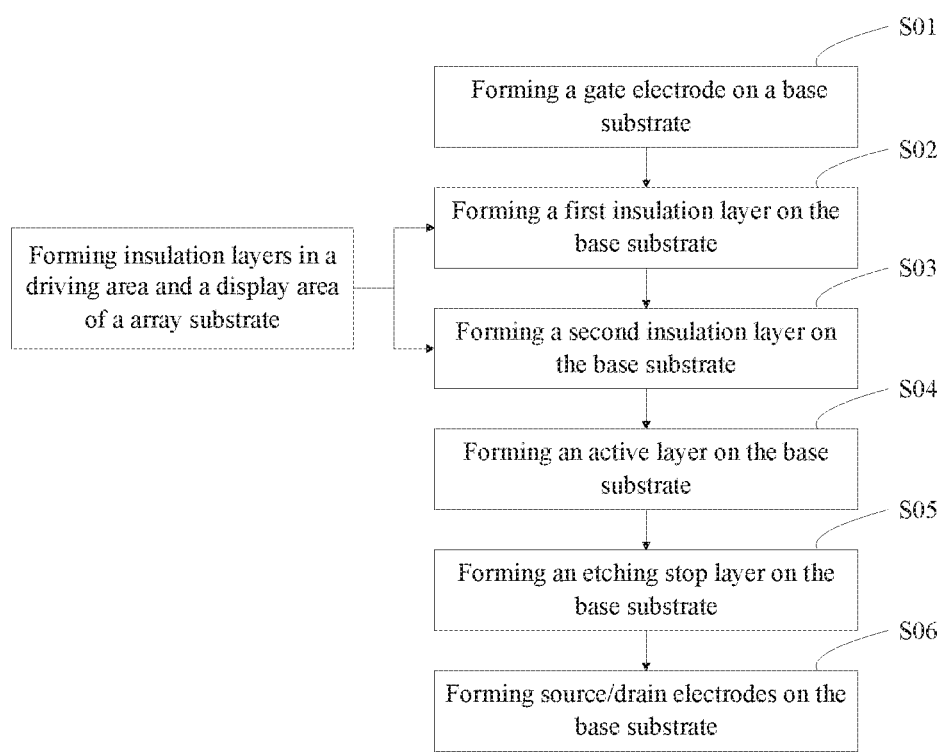
FIG. 7 is a flowchart illuminating a manufacturing method of an array substrate according to an embodiment of the present invention.

FIG. 7 is a flowchart illustrating a manufacturing method of an array substrate according to an embodiment of the present invention.

The embodiment provides a manufacturing method of the above-mentioned array substrate, including a step of forming the above-mentioned insulation layers in the driving area and the display area of the array substrate, wherein the thickness of the insulation layer of the thin film transistor in the driving area is larger than the thickness of the insulation layer of the thin film transistor in the display area.

Specifically, the array substrate as shown in FIG. 3 is manufactured in the following steps:

S01: Forming a gate electrode 2 on a base substrate 1.

A gate metal layer may be deposited on the base substrate 1 in a sputtering or thermal evaporation method. The material of the gate metal layer can be metals such as Cr (chromium), W (wolframium), Ta (tantalum), Mo (molybdenum), Al (aluminum). Cu (copper) and alloys thereof. A pattern of the gate electrode 2 is formed by a patterning process.

In this case, the "patterning process" refers to a process of firstly forming a complete film layer and then removing a part of the film layer to enable the remaining film layer to form the pattern required. Specifically, the removal step therein is achieved by photoetching, and the photoetching usually includes the following steps: coating a photoresist (namely, forming an integral photoresist layer covering the above film layer); exposing (illuminating a part of the area of the photoresist layer by using a mask to change the properties of the photoresist layers on these positions); developing (removing the illuminated part or non-illuminated part in the photoresist layer to expose a part of the film layer); etching (removing the part of the film layer uncovered by the photoresist layer, namely achieving the effect of "removing a part of the film layer"); and stripping the photoresist (removing the remaining photoresist layer, to expose the remaining film layer and form the pattern required).

S02: Forming a first insulation layer 31 on the base substrate 1.

A material of the first insulation layer 31 may be deposited on the base substrate 1 processed in step S01 by using a plasma enhanced chemical vapor deposition (PECVD) method, and then the first insulation layer 31 is formed by a patterning process. In this case, the material of the first insulation layer 31 may be an oxide or a nitride or an oxynitride.

The reason why the first insulation layer 31 is formed at first lies in that:

according to the embodiment of the present invention, the second insulation layers 32 are formed in both the display area and the driving area, but the first insulation layer 31 is only formed in the driving area, namely, when the first insulation layer 31 is formed, a step of removing the material of the entire first insulation layer 31 in the display area must be included. Therefore, if the second insulation layers 32 (which are formed in both the display area and the driving area) are formed at first, when the first insulation layer 31 is prepared, the material of the first insulation layer 31 inevitably covers the second insulation layer 32 in the display area, so that in the etching step, the material of the first insulation layer 31 in the display area cannot be separately removed without damaging the formed second insulation layer 32 (because the materials of the insulation layers are similar or same, thus the insulation layers will be removed together when being etched).

S03: Forming the second insulation layer 32 on the base substrate 1.

Specifically, a material of the second insulation layer 32 may be deposited on the base substrate 1 processed in step S02 by using the plasma enhanced chemical vapor deposition (PECVD) method, and then the second insulation layer 32 is formed by a patterning process. In this case, the material of the second insulation layer 32 may be an oxide or a nitride or an oxynitride.

Figure 4:
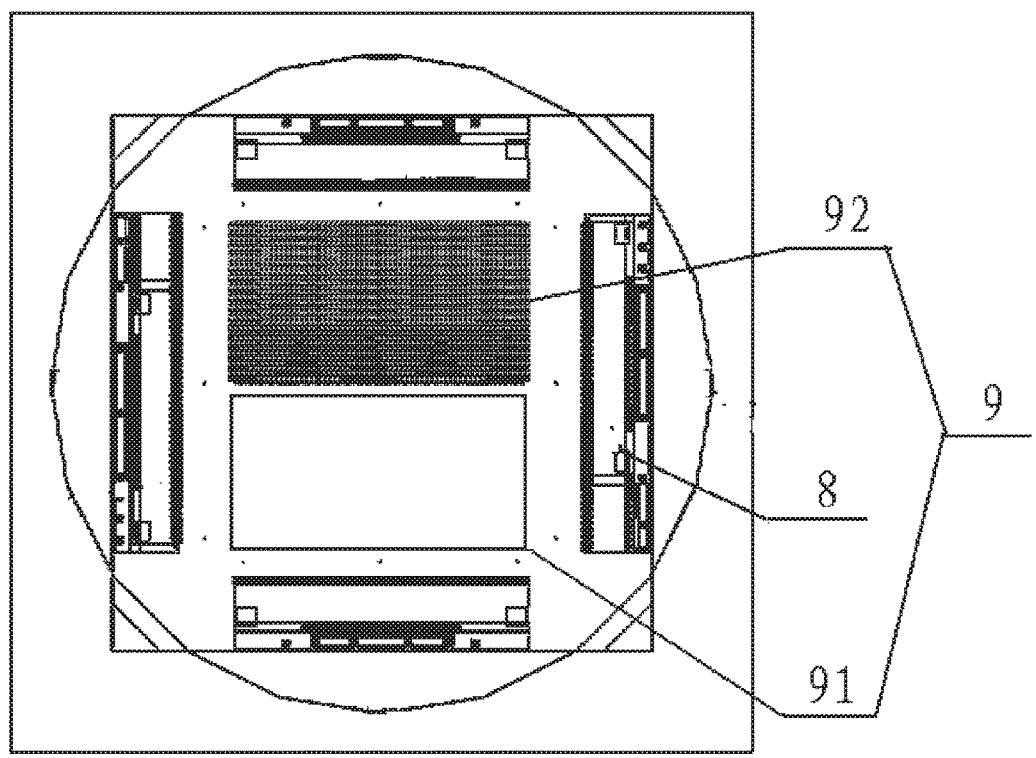
FIG. 4 is a schematic diagram of a mask used for forming an insulation layer of a thin film transistor of an array substrate according to a second embodiment of the present invention.

Preferably, in this step and the former step of forming the first insulation layer 31, the same display area mask 9 can be adopted, as shown in FIG. 4. The mask shown in FIG. 4 includes the display area mask 9 corresponding to the display area and four driving area masks 8 corresponding to the surrounding driving areas respectively. The display area mask 9 includes a blank part 91 without a pattern and a pattern part 92 with a pattern corresponding to the second insulation layer 32 in the display area; and in each step, the photoresist layer in the display area is exposed for multiple times to form the pattern required.

More preferably, the blank part 91 and the pattern part 92 of the display area mask 9 each symmetrically occupy a half of the display area respectively, for example, as shown in FIG. 4, respectively occupy the upper half part and the lower half part.

According to the embodiment of the present invention, in the driving area, the patterns of the first insulation layer 31 and the second insulation layer 32 are same, and thus they can be prepared by using the same driving area mask 8.

However, different from the prior art, the patterns of the first insulation layer 31 and the second insulation layer 32 are different in the display area (specifically in the display area, only the second insulation layer 32 is formed, and no first insulation layer 31 is formed), therefore, in preparation of the first insulation layer 31 and the second insulation layer 32, different display area masks need to be used, which increases the cost.

Therefore, a special display area mask 9 is preferably used in the embodiment, the display area mask 9 including the blank part 91 (namely, a part without a pattern, and can be a part which is completely light transmissive or completely light tight) and the pattern part 92 (namely, a part with a pattern corresponding to the second insulation layer 32 in the display area; a part of positions of the pattern part 92 is light transmissive and a part of positions is light tight), and the display area mask 9 is used twice for exposure in formation of each insulation layer (in the case Where the blank part 91 and the pattern part 92 each occupy a half respectively), to achieve the purpose of preparing different patterns in the display area by using the one display area mask 9.

Specifically, the method of using the above-mentioned display area mask 9 may be as the follows.

when preparing the first insulation layer 31, coating a positive photoresist (commercial article number PRI-2000A) on the material of the first insulation layer 31, then using the blank part 91 of the display area mask 9 to expose different positions (for example, the upper half part and the lower half part) of the display area for twice (it should be noted that, in an exposure manufacture procedure, when the blank part 91 of the display area mask 9 is used to expose the display area, light only passes through the blank part 91 while not passing through the other parts on the mask), then using four driving area masks 8 to expose four driving areas in sequence; then developing, etching and stripping the entire base substrate simultaneously, in order to remove the entire material of the first insulation layer 31 in the display area and only leave the material of the first insulation layer 31 in the four driving areas on the base substrate excluding the display area. Therefore, step S02 is completed.

Figure 5:
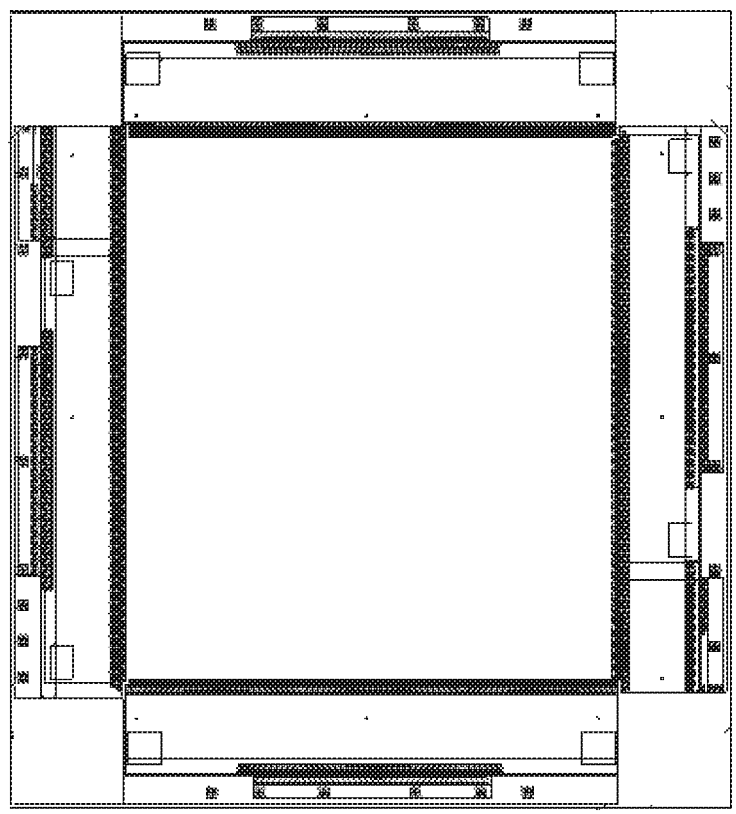
FIG. 5 is a schematic top view of an array substrate according to the second embodiment of the present invention after formation of a pattern of a first insulation layer.

As shown in FIG. 5, after the patterning process of the first insulation layer 31 is completed on the array substrate, no pattern (the material of the first insulation layer 31 is etched off) is formed in the display area located at the center on the array substrate, and the pattern of the first insulation layer 31 is formed in the surrounding driving areas.

When preparing the second insulation layer 32, similarly coating the positive photoresist on the material of the second insulation layer 32, then using the pattern part 92 of the display area mask 9 to expose different positions (for example, the upper half part and the lower half part) of the display area twice (it should be noted that, in the exposure manufacture procedure, when the pattern part 92 of the display area mask 9 is used to expose the display area, light only passes through the pattern part 92 while not passing through the other parts on the mask), then using the four driving area masks 8 to expose the four driving areas in sequence; then developing, etching and stripping the entire base substrate simultaneously, in order to form the pattern of the second insulation layer 32 in the display area and the pattern of the second insulation layers 32 in the four driving areas excluding the display area. Therefore, step S03 is completed.

Figure 6:
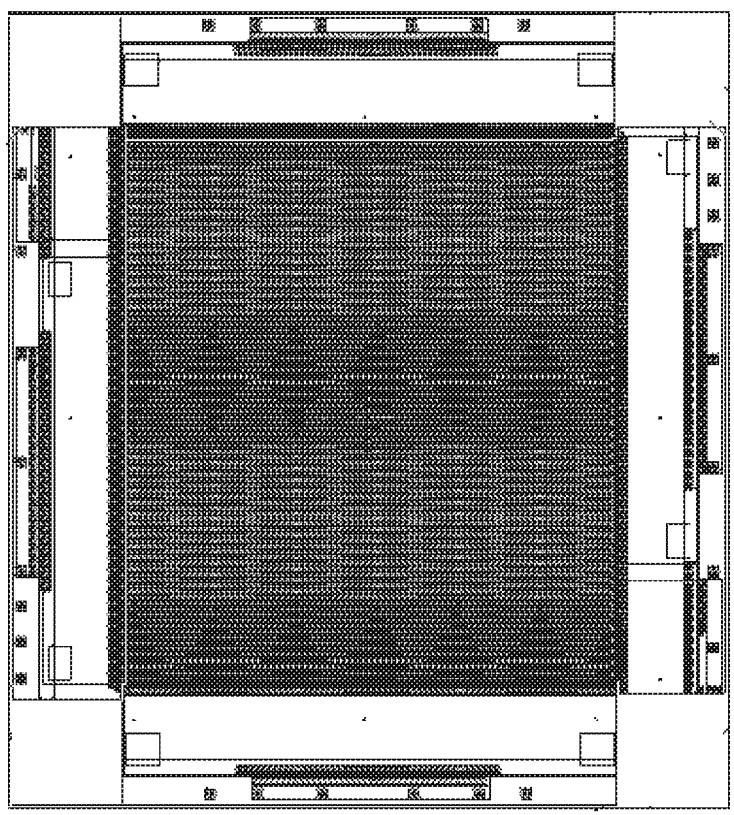
FIG. 6 is a schematic top view of the array substrate according to the second embodiment of the present invention after formation a pattern of a second insulation layer.

As shown in FIG. 6, after the patterning process of the pattern of the second insulation layers 32 is completed on the array substrate, the pattern of the second insulation layers 32 are formed in the display area at the center of the array substrate and the driving areas surrounding the display area.

It should be understood that in the foregoing description, the blank part 91 and the pattern part 92 of the display area mask 9 each respectively occupy a half of the display area, but it is also feasible if the proportions of the two parts are different, but more times of exposure may be needed in one step.

Meanwhile, in the above-mentioned exposure process, the display area mask 9 and the driving area masks 8 may be spliced together, in order to simultaneously expose the display area and the driving areas; or, the display area mask 9 and the driving area masks 8 may also be separated, in order to respectively expose the display area and the driving areas.

In steps S02 and S03, since the display area mask 9 including the blank part 91 and the pattern part 92 is adopted, an insulation layer structure, in which the thickness of the insulation layer of the thin film transistor in the driving area is larger than the thickness of the insulation layer of the thin film transistor in the display area, is obtained without increasing the cost of the mask.

Preferably, the thickness of the second insulation layer 32 is 1000-3000 Å, while the thickness of the first insulation layer 31 can be adjusted according to different application conditions of the array substrate and is generally set to 2000-6000 Å. In this case, the thickness of the second insulation layer 32 can make basic features of the thin film transistor in the display area meet the application requirements, and the thickness of the first insulation layer 31 can ensure that the insulation layer 3 of the thin film transistor in the driving area is not broken down.

S04: Forming an active layer 5 on the base substrate 1.

Specifically, a material layer of the active layer 5 can be firstly deposited on the base substrate 1 processed in step S03 by magnetron sputtering, thermal evaporation or other film forming method, and then a pattern of the active layer 5 is formed by a patterning process.

S05: Forming an etching stop layer 4 on the base substrate 1.

Specifically, a material layer of the etching stop layer 4 can be firstly deposited on the base substrate 1 processed in step S04 by magnetron sputtering, thermal evaporation or other film forming method, and then patterns of the etching stop layer 4 and the vias 7 are formed by a patterning process.

S06: Forming source/drain electrodes 6 on the base substrate 1.

specifically, a material layer of source/drain electrodes 6 can be firstly deposited on the base substrate 1 processed in step S05 by magnetron sputtering, thermal evaporation or other film forming method, and patterns of the source/drain electrodes 6 are formed by a patterning process.

Optionally, other necessary functional layers can be formed thereafter, and will not be repeated redundantly herein one by one.

In the manufacturing method of the array substrate of the present invention, since the display area mask 9 including the blank part 91 and the pattern part 92 is adopted, an insulation layer structure, in which the thickness of the insulation layer 3 of the thin film transistor in the driving area is larger than the thickness of the insulation layer 3 of the thin film transistor in the display area, is obtained without increasing the cost of the mask.

Third Embodiment

The embodiment provides a display panel, including the above-mentioned array substrate.

Fourth Embodiment

The embodiment provides a display device, including the above-mentioned display panel.

In the display panel and the display device of the present invention, the thickness of the insulation layer of the thin film transistor in the driving area is larger than the thickness of the insulation layer of the thin film transistor in the display area. Therefore, when electrostatic discharge occurs between the gate electrode and the source/drain electrodes of the driving area, breakdown of the insulation layer can be prevented, thereby resulting in no short circuit of the gate electrode and the source/drain electrodes; in addition, the insulation layer is also a dielectric layer for a storage capacitor (the capacitor formed between the gate electrode and the source/drain electrodes), and since the thickness of the insulation layer of the thin film transistor in the display area is small, the storage capacitance of the display area can be maintained or increased: meanwhile, since the thickness of the insulation layer of the thin film transistor in the display area is small, adverse effects such as a reduced migration rate and threshold voltage drift of the thin film transistor in the display area will not be caused.

It should be understood that the foregoing embodiments are merely exemplary embodiments used for illustrating the principle of the present invention, but the present invention is not limited hereto. Those skilled in the art can make various variations and improvements without departing from the spirit and essence of the present invention, and these variations and improvements shall fall within the protection scope of the present invention.

The invention claimed is:

1. A manufacturing method of an array substrate, comprising a step of forming a first insulation layer in a driving area of the array substrate and forming a second insulation layer in a display area of the array substrate, wherein
    a first thin film transistors is provided in the driving area, and a second thin film transistor is provided in the display area;
    the first insulation layer is arranged between a gate electrode and an active layer of the first thin film transistor, the second insulation layer is arranged between a gate electrode and an active layer of the second thin film transistor; and a maximum thickness of the first insulation layer between the gate electrode and the active layer of the first thin film transistor is larger than a maximum thickness of the second insulation layer between the gate electrode and the active layer of the second thin film transistor,
    wherein the step of forming the first insulation layer in the driving area of the array substrate and forming the second insulation layer in the display area of the array substrate comprises:
    a step of forming, by using a patterning process, a first pattern comprising the first insulation layer of the first thin film transistor in the driving area; and
    a step of forming, by using a patterning process, a second pattern comprising the second insulation layer of the second thin film transistor in the display area, wherein a part of the second pattern is formed in the driving area and is on the first pattern, wherein
    in the step of forming the first pattern and the step of forming the second pattern, a same display area mask is adopted, the display area mask comprising a blank part without a pattern and a pattern part with a pattern corresponding to the second insulation layer in the display area; and
    in the step of forming the first pattern and the step of forming the second pattern, a photoresist layer in the display area is exposed for multiple times to form a pattern required.

2. The manufacturing method of the array substrate of claim 1, wherein the blank part and the pattern part of the display area mask each symmetrically occupy a half of the display area respectively.

* * * * *